United States Patent
Liu et al.

(10) Patent No.: US 9,721,810 B2
(45) Date of Patent: Aug. 1, 2017

(54) METHODS FOR ENHANCING P-TYPE DOPING IN III-V SEMICONDUCTOR FILMS

(75) Inventors: Feng Liu, Salt Lake City, UT (US); Gerald Stringfellow, Salt Lake City, UT (US); Junyi Zhu, Lakewood, CO (US)

(73) Assignee: University of Utah Research Foundation, Salt Lake City, UT (US)

( * ) Notice: Subject to any disclaimer, the term of this patent is extended or adjusted under 35 U.S.C. 154(b) by 0 days.

(21) Appl. No.: 13/322,403

(22) PCT Filed: Oct. 28, 2011

(86) PCT No.: PCT/US2011/058427
§ 371 (c)(1),
(2), (4) Date: Nov. 23, 2011

(87) PCT Pub. No.: WO2012/058618
PCT Pub. Date: May 3, 2012

(65) Prior Publication Data
US 2013/0203243 A1    Aug. 8, 2013

Related U.S. Application Data

(60) Provisional application No. 61/407,657, filed on Oct. 28, 2010.

(51) Int. Cl.
*H01L 21/20* (2006.01)
*H01L 21/36* (2006.01)
*H01L 21/02* (2006.01)

(52) U.S. Cl.
CPC .......... *H01L 21/36* (2013.01); *H01L 21/0262* (2013.01); *H01L 21/02538* (2013.01);
(Continued)

(58) Field of Classification Search
CPC ............... H01L 21/36; H01L 21/02538; H01L 21/02543; H01L 21/02579;
(Continued)

(56) References Cited

U.S. PATENT DOCUMENTS 3,146,137 A    8/1964 Williams et al.
3,975,218 A *   8/1976 Ruehrwein ......... H01L 21/0237
                                               117/91
(Continued)

FOREIGN PATENT DOCUMENTS

JP      2002-190648      5/2002

OTHER PUBLICATIONS

J.Y. Zhu, Feng Liu, G.B. Stringfellow, Dual-Surfactant Effect to Enhance Doping in III-V Semiconductor Thin Films, Physical Review Letters, 101, 196103 (2008).*
(Continued)

*Primary Examiner* — Cheung Lee
*Assistant Examiner* — Stephen C Smith
(74) *Attorney, Agent, or Firm* — Thorpe North & Western, LLP

(57) ABSTRACT

Methods of doping a semiconductor film are provided. The methods comprise epitaxially growing the III-V semiconductor film in the presence of a dopant, a surfactant capable of acting as an electron reservoir, and hydrogen, under conditions that promote the formation of a III-V semiconductor film doped with the p-type dopant. In some embodiments of the methods, the epitaxial growth of the doped III-V semiconductor film is initiated at a first hydrogen partial pressure which is increased to a second hydrogen partial pressure during the epitaxial growth process.

19 Claims, 6 Drawing Sheets

(52) U.S. Cl.
CPC .. *H01L 21/02543* (2013.01); *H01L 21/02579* (2013.01); *H01L 21/02581* (2013.01); *Y10S 117/913* (2013.01)

(58) Field of Classification Search
CPC ........... H01L 21/02581; H01L 21/0262; H01L 21/0254; H01L 21/02546; Y10S 117/913
USPC .......................................... 136/255; 438/483
See application file for complete search history.

(56) References Cited

U.S. PATENT DOCUMENTS

| | | | | |
|---|---|---|---|---|
| 6,447,604 | B1* | 9/2002 | Flynn ..................... | C30B 25/00 117/89 |
| 6,625,187 | B1 | 9/2003 | Ikoma et al. | |
| 6,858,519 | B2* | 2/2005 | Johnson .................. | H01S 5/183 438/29 |
| 6,862,312 | B2* | 3/2005 | Fafard ............................ | 372/71 |
| 7,122,734 | B2* | 10/2006 | Fetzer et al. ................... | 136/252 |
| 8,410,496 | B2* | 4/2013 | Hersee ................... | B82Y 20/00 257/91 |
| 8,410,523 | B2* | 4/2013 | Huffaker ................ | B82Y 20/00 257/103 |
| 8,524,581 | B2* | 9/2013 | Kraus ............... | H01L 21/02436 257/189 |
| 2003/0178633 | A1* | 9/2003 | Flynn ................... | H01L 29/155 257/101 |
| 2007/0006801 | A1* | 1/2007 | Stringfellow ........... | C30B 25/02 117/104 |
| 2007/0068572 | A1* | 3/2007 | Fetzer et al. ................... | 136/262 |
| 2009/0078311 | A1* | 3/2009 | Stan et al. ..................... | 136/255 |
| 2009/0169828 | A1 | 7/2009 | Hersee et al. | |

OTHER PUBLICATIONS

A. D. Howard, D. C. Chapman and G. B. Stringfellow, Effects of Surfactants Sb and Bi on the Incorporation of Zinc and Carbon in III/V Materials Grown by Organometallic Vapor-Phase Epitaxy, Journal of Applied Physics 100, 044904 (2006) (published online Aug. 21, 2006).*

D.C. Chapman, A.D. Howard and G.B. Stringfellow, Zn Enhancement During Surfactant-Mediated Growth of GaInP and GaP, Journal of Crystal Growth, 287 (2006) 647-651.*

J.Y. Zhu, Feng Liu,* and G. B. Stringfellow, Dual-Surfactant Effect to Enhance p-Type Doping in III-V Semiconductor Thin Films, Physical Review Letters, 196103-3, Nov. 7, 2008.*

Zhu, et al., Enhanced Cation-Substituted P-Type Doping in GaP from Dual Surfactant Effects, Journal of Crystal Growth, vol. 312, Issue 2, Jan. 1, 2010, 174-179; Elsevier.

Copel, et al., Surfactants in Epitaxial Growth, Physical Review Letters, vol. 63, Aug. 7, 1989, 632.

Rosenfeld, et al., Layer by Layer Growth of Ag on Ag(111)Induced by Enhanced Nucleation: a Model Sutdy for Surfactant-Mediated Growth, Physical Review Letters, vol. 71, Aug. 9, 1993, 895.

Meyer, et al., Importance of the Additional Step-Edge Barrier in Determining Film Morphology During Epitaxial Growth, Phys. Rev. B51, May 15, 1995, 14790.

Pillai, et al., Bismuth-Containing Compounds, J. Vac. Sci. Technol. B vol. 18, No. 3, Mar. 17, 2000, 1232-1236.

Fetzer, et al., The Use of a Surfactant (Sb) to Induce Triple Period Ordering in GaInP, Applied Physics Letters, vol. 76, No. 11, Mar. 13, 2000, 1440-1442.

Chapman et al., An Enhancement During Surfactant-Mediated Growth of GaInP and Gap, Journal Crystal Growth, vol. 287, Issue 2, Jan. 25, 2006, 647-651.

Howard, et al., Effects of Surfactants Sb and Bi on the Incorporation of Zinc and Carbon in III/V Materials Grown by Organometallic Vapor-Phase Epitaxy, J. Appl Phys. vol. 100, Issue 4, Aug. 15, 2006, 44904.

Wixom, et al., Sb and Bi Surfactant Effects on Homo-Epitaxy of GaAs on (001) Patterned Substrates, Journal of Crystal Growth, vol. 265, Issue 3, May 1, 2004, 367-374.

Shurtleff, et al., Surfactant Effects on Doping of GaAs Grown by Organometallic Vapor, Phase Epitaxy, Applied Physics Letters, vol. 78, No. 20, May 14, 2001, 3038-3040.

Zhu, et al., Dual-Surfactant Effect to Enhance p-Type Doping in III-V Semiconductor Thin Films, Phys. Rev. Lett 101, Nov. 7, 2008, 196103.

Zhang, et al., Generalized Electron Counting in Determination of Metal-Induced Reconstruction of Compound Semiconductor Surfaces, Phys. Rev. Lett. 97, Sep. 19, 2006, 126103.

Sugiyama et al., X-Ray Standing-Wave Study of an Sb-Terminated GaAs(001)-(2X4) Surface, Phys. Rev. B 52, Jul. 15, 1995, 2678.

McCluskey et al., Spectroscopy of Hydrogen-Related Complexes in GaP:Zn, Appl. Phys. Lett. 65, Jun. 13, 1994, 2191.

* cited by examiner

US 9,721,810 B2

METHODS FOR ENHANCING P-TYPE DOPING IN III-V SEMICONDUCTOR FILMS

CROSS-REFERENCE TO RELATED APPLICATIONS

This application claims the benefit of U.S. Provisional Application No. 61/407,657, filed Oct. 28, 2010, the content of which is incorporated herein by reference in its entirety.

REFERENCE TO GOVERNMENT RIGHTS

This invention was made with government support under grant number DE-FG02-04ER46148 awarded by the U.S. Department of Energy. The US government has certain rights in this invention.

TECHNICAL FIELD OF THE INVENTION

The present invention relates to the field of epitaxial growth, and in particular to methods of doping III-V semiconductor film.

BACKGROUND OF THE INVENTION

In epitaxial growth, surfactants have proved to be effective in controlling the thin film microstructure, composition and morphology and, hence, to improve the thin film properties and device performance. Copel et al. in 1989 first used As as a surfactant in the growth of Si/Ge/Si(001) to suppress island formation [1]. Surfactant effects may affect crystal growth in various ways. For example, surfactants can change the growth mode. In addition to Copel's work [1], the growth mode of Ag on Ag(111) is also changed when Sb is used as a surfactant [2,3]. Additionally, surfactants can reduce interface roughness. For example, Bi as a surfactant reduces the surface roughness of InGaAs grown on GaAs substrates [4]. Moreover, interface alloy intermixing can be suppressed by surfactants. For example, H can suppress the interface intermixing of Ge(001) covered Si [5]. Furthermore, surfactants can be used to change the surface reconstruction and, hence, control the formation of various new ordered phases. For example, Sb is known to suppress Cu—Pt ordering in GaInP [6]. At higher concentrations, surfactants can change the surface reconstruction from (2×4) to (2×3)—for example, inducing a new ordered phase in InGaP [6]. Also, surfactants can affect the incorporation of dopants in semiconductors [7,8].

The surfactant effects listed above may be attributed to several physical mechanisms. Surfactants can change the growth thermodynamics by altering the surface energy. For example, surface As is known to lower the surface energy of the Si/Ge/Si system to suppress island formation [1]. In addition to changing the thermodynamics, surfactants can change the growth kinetics, such as surface diffusion [2] and the size of step-edge barriers [3]. For example, Sb as a surfactant has been shown to reduce the mobility of Ag adatoms. This results in a higher island density leading to a change of growth mode. Sb as a surfactant on Ag (111) or GaAs can also reduce the step edge barrier and promote smoother growth morphologies [3,9].

Obtaining high doping levels in high band gap materials has been a difficult problem for decades. This hinders high-level p-type doping in III-V materials such as phosphide and nitride semiconductors. This may be caused by several factors, including the limited solubility of acceptors, H passivation of acceptors, and high acceptor-hole binding energies [10,11]. An effective approach to achieving high p-type doping levels in GaInP, GaP, and GaAs employs the use of surfactants during organometallic vapor-phase epitaxy (OMVPE) growth [6-8]. For example, a recent study showed that Sb can be used to enhance the incorporation of dopants, such as Zn [7,8], and reduce unintentional impurities, such as C, S, and Si [8]. In addition to Sb, surface H was postulated to play a role in the doping process [7,8]. The enhanced Zn doping was speculated to be caused by kinetic and/or thermodynamic factors. The presence of Sb may increase the surface diffusion of Zn and allow more Zn to reach step edges and incorporate into the film [12]. Also, the neutral Zn—H complexes have a lower film doping energy than the isolated Zn [7]. However, there remains insufficient understanding of the underlying doping mechanisms associated with surfactants because it is impossible to directly observe the microscopic doping process.

SUMMARY OF THE INVENTION

Methods of doping III-V semiconductor film are provided. The methods comprise epitaxially growing III-V semiconductor film in the presence of a dopant, a surfactant capable of acting as an electron reservoir (e.g., antimony, bismuth), and hydrogen, under conditions that promote the formation of III-V semiconductor film doped with the p-type dopant. Suitable dopants include zinc, magnesium, beryllium and cadmium.

In some embodiments of the methods, the epitaxial growth of the doped III-V semiconductor film is initiated at a first hydrogen partial pressure which is increased to a second hydrogen partial pressure during the epitaxial growth process.

Some embodiments of the methods include annealing the doped III-V semiconductor film at a temperature and for a time sufficient to remove co-doped hydrogen from the III-V semiconductor film.

Additional features and advantages of the invention will be set forth in the description which follows, and in part will be obvious from the description, or may be learned by the practice of the invention. The features and advantages of the invention may be realized and obtained by means of the instruments and combinations particularly pointed out in the appended claims. These and other features of the present invention will become more fully apparent from the following description and appended claims, or may be learned by the practice of the invention as set forth hereinafter.

BRIEF DESCRIPTION OF THE DRAWINGS

In order to describe the manner in which the above-recited and other advantages and features of the invention can be obtained, a more particular description of the invention briefly described above will be rendered by reference to specific example embodiments thereof which are illustrated in the appended drawings. Understanding that these drawings depict only typical implementations of the invention and are not therefore to be considered to be limiting of its scope, the invention will be described and explained with additional specificity and detail through the use of the accompanying drawings.

DETAILED DESCRIPTION OF THE INVENTION

Figure 1:
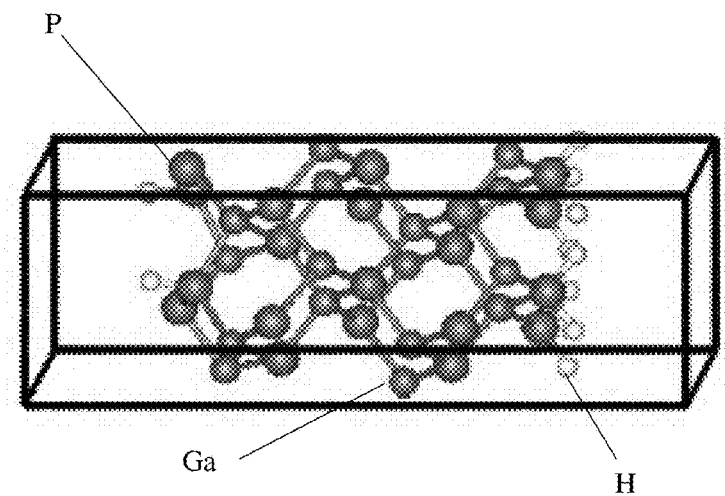
FIG. 1 depicts the schematics of GaP supercell slab, wherein the largest spheres represent P, the medium spheres represent Ga, and the smaller spheres represent H.

As used herein, and unless otherwise specified, "a" or "an" means "one or more." As will be understood by one skilled in the art, for any and all purposes, particularly in terms of providing a written description, all ranges disclosed herein also encompass any and all possible subranges and combinations of subranges thereof. Any listed range can be easily recognized as sufficiently describing and enabling the same range being broken down into at least equal halves, thirds, quarters, fifths, tenths, etc. As a non-limiting example, each range discussed herein can be readily broken down into a lower third, middle third and upper third, etc. As will also be understood by one skilled in the art, all language such as "up to," "at least," "greater than," "less than," and the like includes the number recited and refers to ranges which can be subsequently broken down into subranges as discussed above. Finally, as will be understood by one skilled in the art, a range includes each individual member.

One example embodiment of the present invention provides one or more methods for p-type doping III-V semiconductors, such as GaP, using a surfactant capable of acting as an electron reservoir. Examples of such surfactants include such as Sb and Bi. In addition, example embodiments of the present invention provide methods for p-type doping III-V semiconductors using a surfactant in the presence of H. For example, the use of the above example surfactants in the presence of H can=create what can be called a dual-surfactant effect of Sb and H for p-type doping enhancement for dopants such as Zn, Cd, Mg and Be. The dual-surfactant effect, which relies on two surface elements, greatly broadens the scope and application of the conventional surfactant effect which relies on only one surface element. The dual-surfactant effect relies on two surface H atoms and an H in the bulk serves as a co-dopant. Specifically, in order to accommodate the p-type dopant incorporation, the role of the surfactant (e.g., Sb—a "metallic" element) is to provide an electron reservoir to redistribute electrons, the role of the two surface H atoms is to satisfy the electron counting rule (ECR) at the surface before doping, and the role of the co-doped H (a "single electron") is to add one electron to satisfy the ECR in the bulk after the doping. Later annealing allows the co-doped H to diffuse away.

For the purposes of this disclosure, a surfactant in epitaxial growth is defined as an active element that floats on top of the growing film surface. It is usually a single foreign element. Here, the term "film" doping energy is used to refer to the energy change for a dopant atom (e.g., Zn) replacing a cation atom (e.g., Ga) in the sub-surface position during the epitaxial growth process, as distinguished from the "bulk" doping energy for a dopant atom replacing a cation atom in the bulk. The methods described herein can also be incorporated in MBE and CBE processes. In addition, the term "under conditions that promote the formation of III-V semiconductor film doped with p-type dopant," includes a variety of such conditions that are known to someone skilled in the art.

EXAMPLES

First-principles calculations of Zn, Mg, Be and Cd incorporation in (001) GaP films under the influence of surface Sb and H were carried out. It was found that Sb alone has little effect on the film doping energy of all the dopants in GaP film, and it was only when H was also present that the film doping energy was substantially lowered by Sb. Also, surface H did not function as effectively alone without Sb. Without intending to be bound to any particular theory of the invention, the inventors believe that it is the combined effect of Sb and H (a dual-surfactant effect) that makes the p-type doping processes thermodynamically favorable. The role of Sb in producing the dual-surfactant effect is to serve as an electron reservoir to accommodate the redistribution of electrons, in a similar spirit to the generalized ECR in the semiconductor surface with metal elements [14]. The role of H is to supply the one electron missing from the p-type dopant, so that the system can satisfy the ECR [15]. Experimentally, it is difficult to achieve high doping levels of Mg and Zn in III-V systems [8,16]. The present invention represents an important breakthrough that provides a common strategy for improved p-type doping during epitaxial growth of III-V compounds.

In order to arrive at the present invention, calculations were performed using the Vienna ab initio simulation package [17] within the local density approximation. GaP (001) films were modeled by the same technique as applied in the calculation on the dual surfactant effect of Sb and H on Zn in GaP described in Zhu et al., Phys. Rev. Lett. 101 (2008) 196103, the entire disclosure of which is incorporated herein by reference.

In the calculation, the (2×2) reconstructed surface was chosen, as shown in FIG. 1 and as explained in Zhu et al., Phys. Rev. Lett. 101 (2008) 196103. To obtain the film doping energy during epitaxial growth, one Ga atom in the first (FIG. 2) or second (FIG. 3) cation layer was replaced with a p-type dopant atom and the energy difference between the doped system and the undoped system was calculated. The effect of surfactant Sb on the film doping energy was calculated by replacing surface P dimers with Sb dimers, assuming the surface reconstruction remains the same [20]. The effect of H as the second surfactant was studied by introducing different concentrations and configurations of H on the surface. The film doping energy is defined as: $\Delta E_{doping} = E_{doped} - E_{undoped} + \mu_{Ga} - \mu_{Dopant}$, where $E_{doped}$ ($E_{undoped}$) is the total energy of the doped (undoped) system, i.e., supercell; and $\mu_{Ga}(\mu_{Dopant})$ is the chemical potential of Ga (dopant). In general, $\mu_{Ga}$ may vary from $\mu_{Ga}[bulk] + \Delta H_f[GaP]$ (the P-rich condition) to $\mu_{Ga}[bulk]$ (the Ga-rich condition) [21], where $\Delta H_f[GaP]$ is the GaP enthalpy of formation; and $\mu_{Dopant}$ equals $\mu_{Dopant}[bulk]$. In calculating the change of film doping energy due to surfactant Sb, $\mu_{Ga}$ and $\mu_{Zn}$ do not appear. In the case of H, the film doping energy depends on the chemical potential of H ($\mu_H$) if one additional H is added to the system upon doping. The chemical potential of H is a variable strongly depending upon the growth condition. Here, the typical value of $\mu_H = -0.67$ eV, one-half of the energy of an $H_2$ molecule at T=900K, p=1 atm was chosen [22]. This is different from the value used in the analysis of Zhu et al., *Phys. Rev. Lett.* 101 (2008) 196103, which would correspond to a H partial pressure of $10^{-10}$ atm, unrealistically low for OMVPE growth. Also, in OMVPE growth, there is a large catalytic effect of the phosphide surface on the decomposition of precursors [23]. So the actual chemical potential of the atomic H may be difficult to estimate due to non-equilibrium conditions at the surface. The chemical potential given here in the gas phase may be considered as the lower limit, because the actual H chemical potential could be higher due to the surface adsorption and decomposition of the precursor [23]. This would lead to a larger doping energy drop due to the extra H than our estimation.

First, the doping energy differences of bulk vs. film without surfactant were studied. The p-type doping energy in bulk GaP was calculated as a reference. Then, the p-type film doping energy in the surface positions of a GaP (0 0 1) film was calculated by replacing the Ga in the first cation layer (FIG. 2a). Also, to exclude the possible surfactant enhancement effect of H, H on the top of the 2×2 surface was not included in this calculation. The bulk and film doping energies were obtained for Zn, Be, Mg, Cd, as shown in Table 1. The fourth column of Table 1 shows the doping energy difference for all the dopants between the film and bulk. It was found that the presence of the surface lowers the doping energy from 0.2 eV to about 1 eV in reference to bulk for different dopants. This difference is possibly due to the covalent radius difference. The covalent radius of Zn is very close to that of Ga and the covalent radius of Be is slightly smaller than that of Ga. Thus, when Zn or Be is incorporated, the difference of doping energy in the bulk vs. in the film is small because of the small strain effect. In contrast, the covalent radii of Cd and Mg are larger than that of Ga, so the presence of surface in the film allows more strain relaxation to accommodate the large size of Cd and Mg, and hence to reduce noticeably the film doping energy relative to that in the bulk.

Next the surfactant effect of Sb was investigated. When Sb is introduced during OMVPE growth, it stays on top of the surface replacing the P surface dimers, due to its large atomic size and lower dangling bond energy (see FIG. 2b). This has been demonstrated experimentally by surface photo reflection spectra [24] and is supported by first-principles calculations [20]. To exclude the possible surfactant enhancement effect of H, H initially was not included on the surface. In the previous study of Zn doping (Zhu et al., *Phys. Rev. Lett.* 101 (2008) 196103), surface P were placed with dimers with Sb dimers without H (FIG. 2b) and obtained $\Delta E_{1st}^{Sb,Zn} = 2.53$ eV$+\mu_{Ga} - \mu_{Zn}$, which is 0.07 eV higher than the P dimer case. This film doping energy difference is defined as $\Delta E_1$ in Table 2. Here, we performed the same calculation for dopants Be, Mg and Cd, and obtained $\Delta E_{1st}^{Sb,Be} = 0.38$ eV$+\mu_{Ga} - \mu_{Be}$ and $\Delta E_{1st}^{Sb,Mg} = 1.99$ eV$+\mu_{Ga} - \mu_{Mg}$ and $\Delta E_{1st}^{Sb,Cd} = 2.93$ eV$+\mu_{Ga} - \mu_{Cd}$ respectively. In comparison to the case of P surface dimers, the corresponding film doping energy changes are $\Delta E_1(Be) = 0.36$ eV, $\Delta E_1(Mg) = -0.15$ eV and $\Delta E_1(Cd) = 0.19$ eV, as listed in Table 2.

Importantly, it was found that for all p-type dopants studied, the film doping energy difference, $\Delta E_1$ (a vs. b in FIG. 2), between the Sb dimer case and the P dimer case is nearly zero (Zn, Mg) or positive (Cd, Mg). This indicates that Sb alone does not significantly enhance the p-type doping of GaP without H.

TABLE 1

Doping energies of bulk and film without surfactant for different dopants.

| | Bulk | Film | $E_{Film} - E_{Bulk}$ (eV) |
|---|---|---|---|
| Be | 0.23 eV + $\mu_{Ga} - \mu_{Be}$ | 0.02 eV + $\mu_{Ga} - \mu_{Be}$ | −0.21 |
| Zn | 2.69 eV + $\mu_{Ga} - \mu_{Zn}$ | 2.46 eV + $\mu_{Ga} - \mu_{Zn}$ | −0.23 |
| Mg | 2.61 eV + $\mu_{Ga} - \mu_{Mg}$ | 2.14 eV + $\mu_{Ga} - \mu_{Mg}$ | −0.47 |
| Cd | 3.69 eV + $\mu_{Ga} - \mu_{Cd}$ | 2.74 eV + $\mu_{Ga} - \mu_{Cd}$ | −0.95 |

TABLE 2

Figure 2:
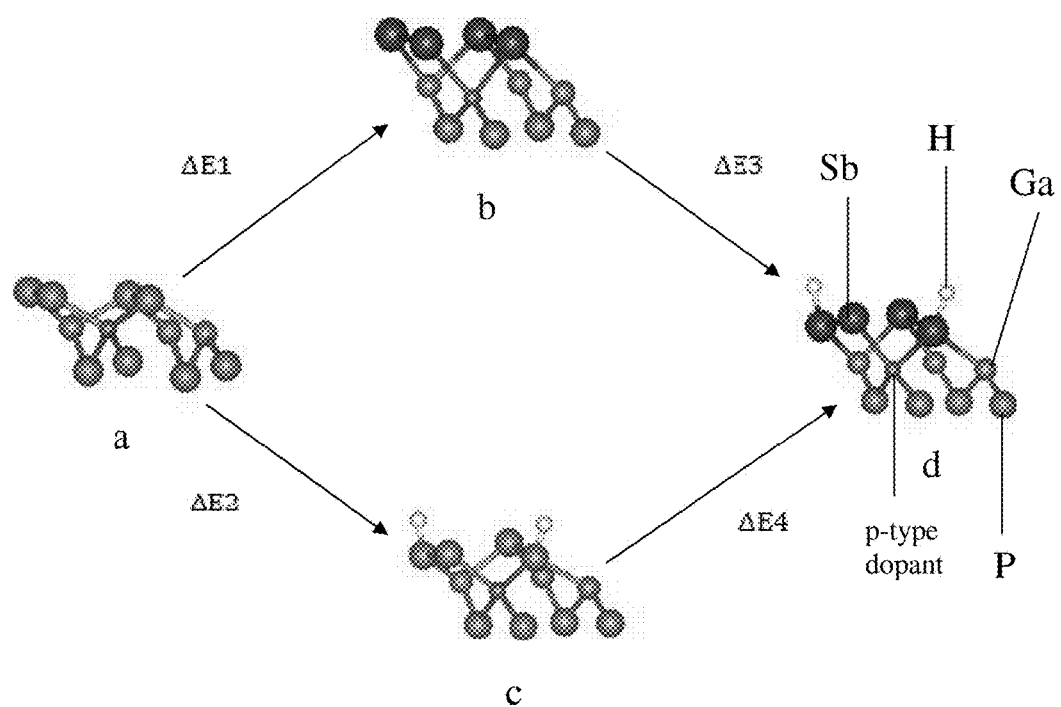
FIG. 2 depicts a schematic illustration of various doping configurations, with one p-type dopant atom replacing a Ga atom in the first cation layer. EE indicates the change of film doping energy from one configuration to another indicated by the arrows, and wherein the largest (black) spheres represent Sb, the second largest (dark) spheres represent P, the medium spheres represent Ga, the smallest (dark) spheres represent p-type dopant, and the second smallest (white) spheres represent H.

Film doping energy difference for p-type dopants with different surface configurations in GaP as shown in FIG. 2.

| | Zn | Mg | Cd | Be |
|---|---|---|---|---|
| $\Delta E_1$(eV) | 0.07 | −0.15 | 0.19 | 0.36 |
| $\Delta E_2$(eV) | 0.22 | 0.07 | 0.55 | 0.41 |
| $\Delta E_3$(eV) | −0.78 | −0.47 | −0.49 | −0.92 |
| $\Delta E_4$(eV) | −0.93 | −0.69 | −0.85 | −0.97 |

Next, the role of H in the doping process was studied. OMVPE growth produces atomic H on the surface [23]. A significant concentration of H (presumably in the form of Zn—H and C—H complexes) is observed in the GaP epitaxial films [8]. Surface H allows the surface to satisfy the ECR [15]. The clean GaP (0 0 1)–(2×2) model surfaces discussed above do not satisfy the ECR. This provides a thermodynamic driving force for H to incorporate into the film.

In order for the GaP (0 0 1)–(2×2) surface to satisfy the ECR, one H can be added to each surface dimer on alternating sides, causing dimer buckling. This has been shown by calculations to have the lowest energy [13]. When Sb is incorporated as a surfactant, the H bonds to the Sb dimers in the same way (see FIG. 2 part d), because Sb is isoelectronic with P. Thus, to investigate the role of H, the film doping energy with surface H was calculated. First, the situation was tested with two surface H/cell without Sb (FIG. 2, part c), assuming that the H coverage remained the same, with two H atoms before and after dopant incorporation. Previously for Zn doping it was found $\Delta E_{1st}^{P-2H \rightarrow 2H} = 2.68$ eV$+\mu_{Ga} - \mu_{Zn}$ [13], which is 0.22 eV higher than the case without H, as shown in FIG. 2, part c vs. a. This shows that without Sb, H alone does not enhance the doping. This film doping energy difference is defined as $\Delta E_3$ in Table 2. It is believed this is largely because the ECR is satisfied before doping, but violated after doping. Here, for the other p-type dopants studied, a similar trend was observed. The film doping energies for the case with H for Mg, Cd and Be are, respectively, 0.07, 0.55 and 0.41 eV higher than the case without H, listed as $\Delta E_2$ in Table 2. So it can be concluded that when H is introduced into the system without Sb, the film doping energy for the p-type dopants doesn't drop.

Next, the combined effects of Sb and H were investigated. Assuming again a surface covered with 2H/cell before and after the p-type dopant incorporation (see FIG. 2 part d), it was previously found that for the case of Zn, $\Delta E_{1st}^{Sb\text{-}2H \to 2H} = 1.75$ eV+$\mu_{Ga}$-$\mu_{Zn}$ [13]. Clearly, the Zn film doping energy is substantially reduced, by 0.78 eV, relative to the bare Sb-terminated surface without H from FIG. 2 part b to d (defined as $\Delta E_3$ in Table 2) and by 0.93 eV relative to the H-covered P-terminated surface without Sb from FIG. 2 part c to d (defined as $\Delta E_4$ in Table 2). This intriguing observation is termed the "dual-surfactant" effect of Sb and H: the two surfactants work together in a constructive manner to lower the Zn film doping energy, while they do not lower the Zn film doping energy individually. For other p-type dopants, a similar trend was found. As shown by the values of $\Delta E_3$ and $\Delta E_4$ in Table 2, the film doping energy for Mg with both Sb and H is 0.47 eV lower than the case with only Sb and 0.69 eV lower than the case with only H. The film doping energy for Cd with both Sb and H is 0.49 eV lower than the case with only Sb, and 0.85 eV lower than case with only H. The film doping energy for Be with both Sb and H is 0.92 eV lower than the case with only Sb and 0.97 eV lower than the case with only H. So the dual surfactant effect can be extended to all the p-type dopants studied: the surfactants Sb and H work together in a constructive manner to lower the p-type film doping energy for a wide range of acceptor elements residing on the group III sublattice. For similar reasons, embodiments of the present invention further include similar systems as described above that include Bi and H.

The above results indicate that the surfactant effect of Sb is enhanced when surface H is also introduced. The underlying physical reason giving rise to the effect of Sb is probably due to the lower electronegativity of Sb in comparison with P, in a similar spirit to the generalized ECR in the semiconductor surface with metal elements proposed recently [14]. Antimony is more metallic than P, so that Sb can serve more effectively as an electron reservoir to accommodate the distribution of electrons when a p-type dopant is present. Since the p-type dopant will violate the ECR by having one less electron, it is easier for Sb than for P to accommodate the missing electron in order to "partially" satisfy the ECR. Also, it can be seen that the dual surfactant effect in decreasing the film doping energy is smallest for Mg, compared with the other three elements. This is probably due to the electronegativity difference among these dopants. Mg, Be, Cd and Zn have electronegativities of 1.31, 1.57, 1.69, 1.65, respectively [25]. So the electronegativity of Mg is noticeably the lowest among all these four elements. Thus, relatively more electrons of Mg can contribute to the electron redistribution, and the dopant Mg itself can be considered as an electron reservoir which might negate part of the electron reservoir effect that Sb contributes to the system. Consequently, Sb and H have the smallest dual surfactant effect for Mg incorporation.

Next, the surface configuration with three surface hydrogen atoms per four Sb atoms was investigated. The ECR is violated after the dopant is incorporated if the surface H remains constant. In order to satisfy the ECR, one additional H has to be added. In a previous study of Zn, to quantify the role of the extra H, the Zn film doping energy was calculated by assuming a surface covered with 2H before, but with 3H after doping (see FIG. 4 parts b-c). It was found that $\Delta E_{1stZn}^{Sb\text{-}2H \to 3H} = -0.63$ eV+$\mu_{Ga}$-$\mu_{Zn}$-$\mu_{H}$=0.04 eV+$\mu_{Ga}$-$\mu_{Zn}$ [13] (note that the G value is different from Ref. [13] due to a different $\mu_H$ used in the present example. The same is true for doping whenever $\mu_H$ appears in the rest of the paper). Clearly, by adding an extra H after doping to satisfy the ECR, the film doping energy of the Zn can be decreased further depending on the H chemical potential ($\mu_H$). Here, the effect of the third H for the case of Mg/Cd/Be was examined, and it was found that $\Delta E_{1stMg}^{Sb\text{-}2H \to 3H} = -0.91$ eV+$\mu_{Ga}$-$\mu_{Zn}$-$\mu_H$=-0.24 eV+$\mu_{Ga}$-$\mu_{Mg}$, $\Delta E_{1stCd}^{Sb\text{-}2H \to 3H} = 0.84$ eV+$\mu_{Ga}$-$\mu_{Cd}$ and $\Delta E_{1stBe}^{Sb\text{-}2H \to 3H} = -2.38$ eV+$\mu_{Ga}$-$\mu_{Be}$, respectively. So once again, the film doping energy of Mg/Cd/Be can be further decreased depending on the chemical potential of H. Since the chemical potential of the H used here is the lower limit, in the actual growth, a larger doping energy drop is expected.

Figure 3:
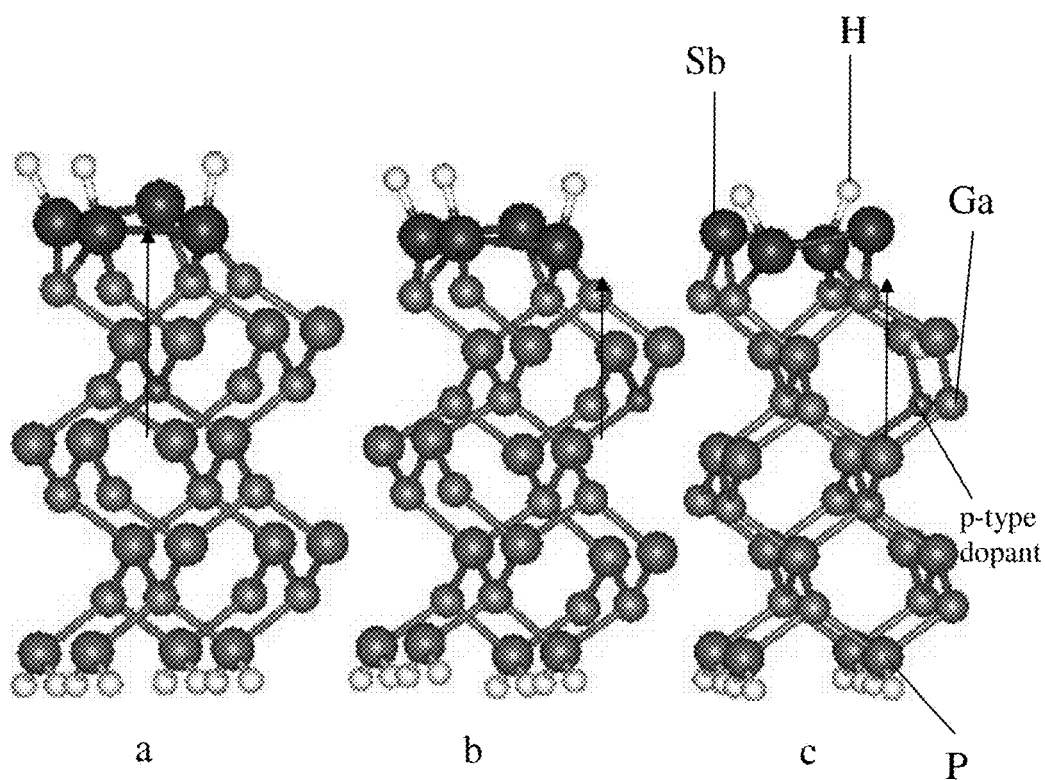
FIG. 3 depicts ball-stick schematic illustration of one p-type dopant atom doped in the second cation layer. Atom labels are the same as in FIG. 2. Part (a) illustrates the dopant atom doped at the site between two surface dimers with three surface H. Part (b) illustrates the dopant atom doped at the site below a surface dimer with three surface H. Part (c) illustrates the dopant atom doped at the site between two surface dimers with two surface H and one bulk H next to dopant. (The arrows indicate the position of the dopant atom relative to the surface dimer.)

So far, the dual-surfactant effect of Sb and H in enhancing the p-type doping in the first cation layer, i.e., the surface position, has been shown. It is also important to investigate the configuration where the dopant replaces a Ga atom at the second cation layer, i.e., the subsurface or "bulk" position. In the previous study of Zn, two possible configurations were considered: one with Zn in the second cation layer between two surface Sb dimers (FIG. 3 part a) and the other directly below the surface Sb dimers (FIG. 3 part b). The respective film doping energies were $\Delta E_{2ndZn,between}^{Sb\text{-}2H \to 3H} = -0.13$ eV+$\mu_{Ga}$-$\mu_{Zn}$ and $\Delta E_{2ndZn,below}^{Sb\text{-}2H \to 3H} = 0.21$ eV+$\mu_{Ga}$-$\mu_{Zn}$ [13].

The 0.08 eV difference between the two reflects the dependence of Zn film doping energy on the "atomic-level" stress at these sites [26] and Zn is slightly favored at the tensile sites between surface dimers relative to the compressive sites directly below surface dimers. Here, this treatment has been expanded to include Mg/Cd/Be and a similar result was found. The respective film doping energies are: $\Delta E_{2ndMg,between}^{Sb\text{-}2H \to 2H} = 0.3$ eV+$\mu_{Ga}$-$\mu_{Mg}$ and $\Delta E_{2ndMg,below}^{Sb\text{-}2H \to 2H} = 0.58$ eV+$\mu_{Ga}$-$\mu_{Mg}$; $\Delta E_{2ndCd,between}^{Sb\text{-}2H \to 2H} = 1.1$ eV+$\mu_{Ga}$-$\mu_{Cd}$ and $\Delta E_{2ndCd,below}^{Sb\text{-}2H \to 2H} = 1.46$ eV+$\mu_{Ga}$-$\mu_{Cd}$; $\Delta E_{2ndBe,between}^{Sb\text{-}2H \to 2H} = -2.25$ eV+$\mu_{Ga}$-$\mu_{Be}$ and $\Delta E_{2ndBe,below}^{Sb\text{-}2H \to 2H} = -2.31$ eV+$\mu_{Ga}$-$\mu_{Be}$. The 0.28 eV energy difference between the two sites for Mg and 0.36 eV energy difference between the two sites for Cd, which are larger than that of Zn are probably due to the larger covalent radii of Mg and Cd [27]. So the tensile site is even more favored by a larger Mg and Cd. Be is slightly favored at the compressive site, which is due to the smaller covalent radius of Be.

Lastly, co-doping of the p-type dopant and H into the GaP bulk was investigated. Experimental observation indicated that complexes of Zn, P and H form during doping of Zn in GaP [28]. This suggests some H goes into the bulk with the acceptor. In the previous Zn study, the energies associated with one H incorporation into the subsurface with Zn was calculated, and the Zn—P—H complex structures were determined. FIG. 3 part c shows the doping of a Zn atom in the subsurface (or "bulk") position along with an H atom next to it. There will be 2H atoms remaining on the surface (in comparison to 3H in FIG. 3 part a), so that the ECR is still satisfied.

When a surface H goes into the subsurface, it changes the dopant bonding configuration, forming a dopant-P—H complex. Without H, the dopant bonds with four neighboring P atoms in an $sp^3$ hybridization (a tetrahedral structure, FIG. 3 part a). With the extra H, one dopant-P bond is broken to form a P—H bond, and the dopant bonds with three neighboring P atoms in an $sp^2$ hybridization (a planar structure, FIG. 3 part c). This can also be explained by the ECR. The dopant provides two valance electrons and the H provides one. For both P—H and P-dopant bonds, this takes ¾ electrons, so their sum gives three electrons total to satisfy the ECR. Thus, when H is co-doped with the dopant, it changes the dopant bonding configuration from sp$^3$ to sp$^2$ hybridization, forming three dopant-P bonds plus an empty orbital.

The co-doping of H with dopant into the subsurface is also found to be energetically favorable. The film doping energy at the 2nd-cation-layer positions forming the Zn—P—H complex was found previously to be $\Delta E_{2ndZn}^{Sb-2H \to 1bulkH} = -0.19$ eV$+\mu_{Ga}-\mu_{Zn}$ [13], which is about 0.2 eV lower than the corresponding cases with all 3H atoms remaining on the surface. This suggests that there exists a thermodynamic driving force for one H atom to go into the subsurface (or "bulk") with the dopant, i.e., co-doping of the Zn with H. The $2^{nd}$ cation layer Mg/Cd/Be doping calculation was also performed. The film doping energy was $\Delta E_{2nd,Mg}^{Sb-2H \to 1bulkH} = -0.29$ eV$+\mu_{Ga}-\mu_{Mg}$, and $\Delta E_{2nd,Cd}^{Sb-2H \to 1bulkH} = -0.80$ eV$+\mu_{Ga}-\mu_{Cd}$ and $\Delta E_{2ndMg,Be}^{Sb-2H \to 1bulkH} = -2.59$ eV$+\mu_{Ga}-\mu_{Be}$. All the energies were lower than the corresponding case with all 3H atoms on the surface. So, similar to H co-doping with Zn into the bulk, it is confirmed that there is a thermodynamic driving force for one H atom to go into the bulk with Mg/Cd/Be. On the other hand, it is known that H would compensate the p-type dopant in bulk GaP, mitigating the doping effect [29,30], which is also confirmed by electronic structure calculations. To activate the acceptor, annealing can be done after the doping process to remove the H [29,30]. In other words, the co-doped H may be removed after it serves its purpose to assist the dopant incorporation.

Figure 4:
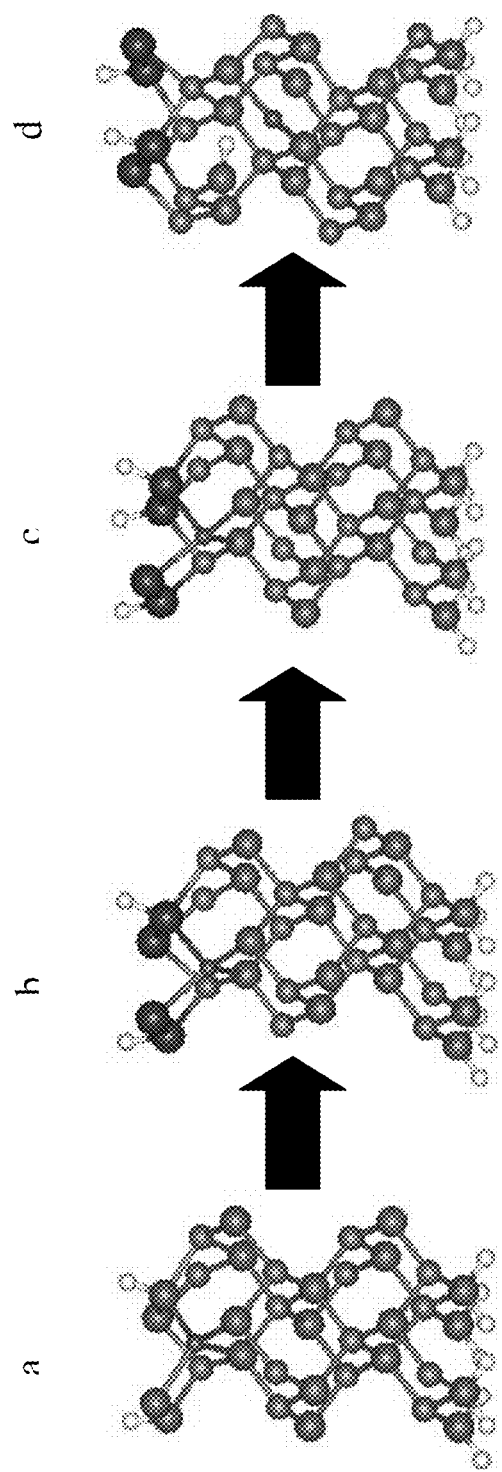
FIG. 4 depicts the schematic illustration of a plausible doping process, with one Mg(Zn) atom replacing a Ga atom in GaP film. Atom labels are the same as in FIG. 1. Part (a) illustrates Mg(Zn) doped into the first cation layer with surface P dimers. Part (b) illustrates Mg(Zn) doped into the first cation layer replacing Ga with surface Sb dimers. Part (c) illustrates one additional H is added onto the surface to satisfy the electron counting rule (ECR). Part (d) illustrates H co-doped with Mg(Zn) into the $2^{nd}$ cation layer to form a Mg(Zn)—P—H complex.

Now, based on all the above calculations, a plausible complete p-type doping process during OMVPE growth is postulated, driven by the dual surfactant effect of Sb and H as shown in FIG. 4 for Mg as an example. The doping of Mg in the original P-terminated surface covered with 2H/cell is shown in FIG. 4 part a. In an example first step, with Sb always replacing the P dimers, a Mg atom is added into the first cation layer (FIG. 4 part b), where it assists the doping process. Two surface H atoms allow the ECR to be satisfied before doping and Sb plays the role of providing an electron reservoir to accommodate the distribution of electrons when the ECR is violated after the key step involving exchange of surface Mg and Ga from the lattice.

In a subsequent example step, one additional H is added to the surface to further assist the doping process by adding one more electron to satisfy the ECR (FIG. 4 part c). In an example third step, the Mg atom goes into the subsurface ("bulk") and replaces a Ga atom in the 2nd or lower cation layers. Simultaneously, a surface H goes together with Mg into the subsurface ("bulk") as a co-dopant to form a Mg—P—H complex, as shown in FIG. 4 part d, where the ECR is satisfied both at the surface and in the bulk at the complex site. The co-doped H needs to be removed later by annealing to activate the acceptor.

Figure 5:
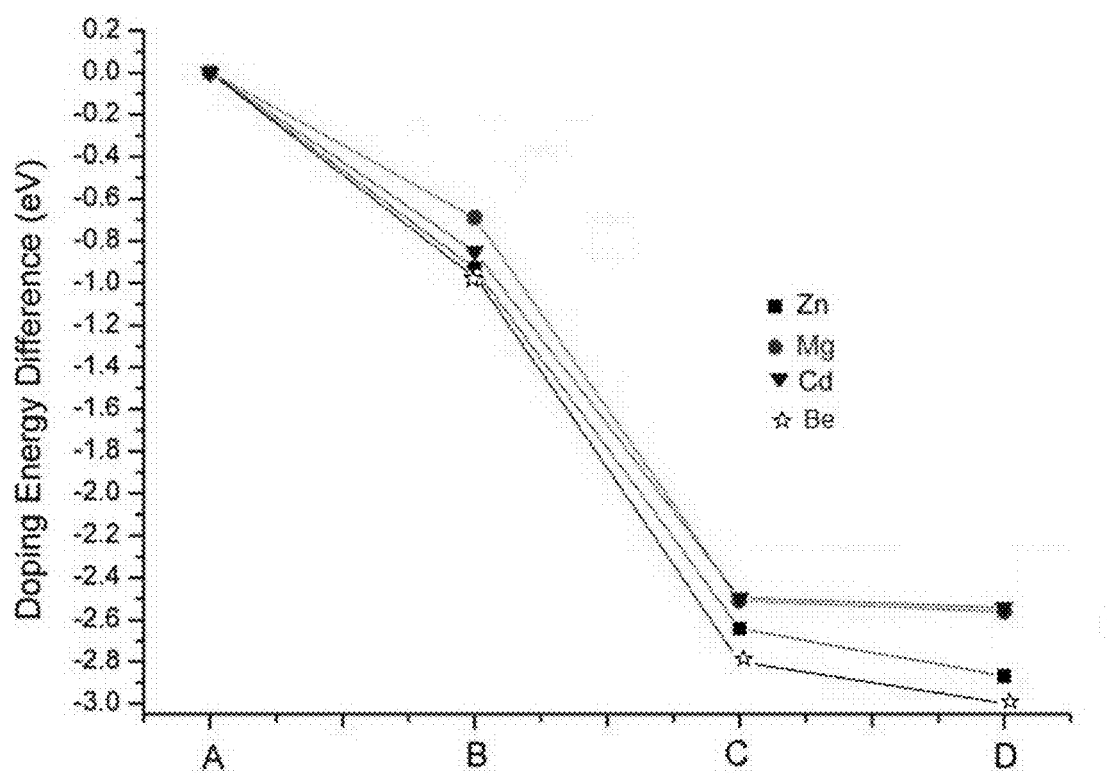
FIG. 5 depicts the change of doping energy at each doping step as shown in FIG. 4, where in the squares represent Zn as dopant, the circles represent Mg as dopant, the triangles represent Cd and the stars represent Be.

The corresponding film doping energy changes are shown in FIG. 5 for the case of Zn, Mg, Cd and Be. The squares are for Zn. The first step has $\Delta E=-0.93$ eV, showing the energy difference between the Sb/2H enhanced system and P/2H system. The second step has $\Delta E=-1.71$ eV, showing the energy difference between the Sb/3H system and Sb/2H system. The third step has $\Delta E=-0.23$ eV, showing the energy difference between the P—Zn—H complex and Sb/3H system. For Mg(circle)/Cd(triangle)/Be(star), the first step has $\Delta E=-0.69$ eV, $-0.85$ eV, and $-0.97$ eV respectively, reflecting the role of Sb and 2H as dual surfactants; the second step has $\Delta E=-1.82$ eV, $-1.65$ eV, and $-1.83$ eV, respectively, reflecting the role of the third H (also, in the growth chamber, due to the higher chemical potential of H than the estimated value, the doping energy drop will be greater than the calculated result); the third step has $\Delta E=-0.05$ eV, $-0.04$ eV, and $-0.2$ eV, reflecting the energy gain in forming P—Mg/Cd/Be—H complex.

Consequently, there is an overall downhill energy landscape for the whole doping process thermodynamically. Notice that the second-step film doping energy with one H added to the system depends on the H chemical potential, while the third-step H film co-doping energy with one H moving from surface to bulk does not. This implies that one may increase the partial pressure of H and hence H chemical potential during growth to further enhance p-type doping in the second step.

This theoretical picture of the dual-surfactant effect and its underlying physical mechanism based on the ECR is qualitatively consistent with the experimental observation of both the enhanced Zn doping with Sb introduction during OMVPE growth and the co-incorporation of H with Zn [7,8]. The overall trend of the calculated energy changes is expected to be correct.

Figure 6:
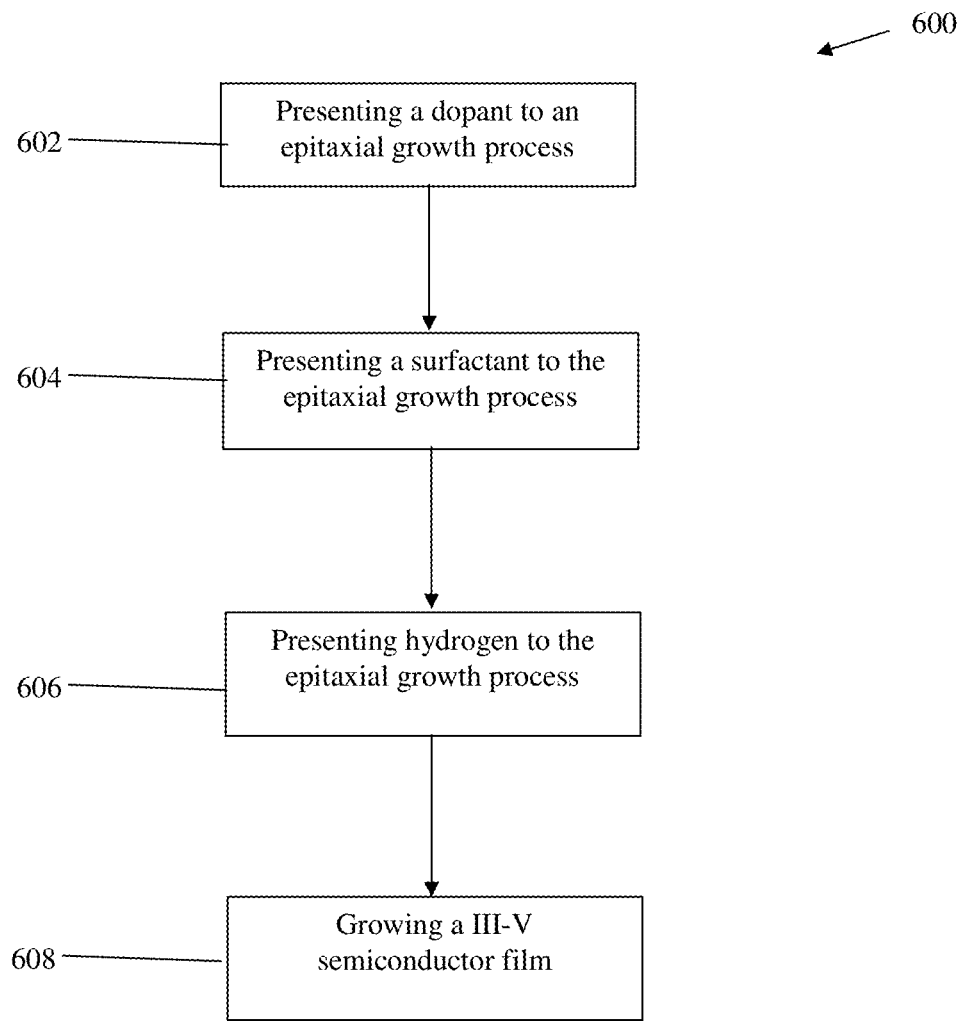
FIG. 6 depicts the illustration and method 600 of doping III-V semiconductor film for presenting a dopant to an epitaxial growth process.

Accordingly, FIGS. 1 through 5 and the corresponding text provide a number of different components, devices and teachings that provide example methods of doping III-V semiconductor film. In addition to the foregoing, example embodiments of the present invention can also be described in terms of flowcharts comprising one or more acts in a method for accomplishing a particular result. For example, FIG. 6 illustrates a method 600 of doping III-V semiconductor film. The acts of FIG. 6 are discussed more fully below with respect the details discussed with reference to FIG. 1 through FIG. 5.

For example, FIG. 6 shows that the method 600 comprises an act 602 of presenting a dopant to an epitaxial growth process. For example, a p-type dopant can be presented to the epitaxial growth process. For example, as described above, the dopant can be selected from the group consisting of magnesium, beryllium and cadmium.

In addition, the method 600 comprises an act 604 of presenting a surfactant to the epitaxial growth process. For example, a surfactant that can act as an electron reservoir can be presented to the epitaxial growth process. For example, as described above, surfactants that can act as the electron reservoir include Sb and Bi.

In addition, the method 600 comprises an act 606 of presenting hydrogen to the epitaxial growth process. For example, hydrogen can be exposed to the epitaxial growth process at a variety of partial pressures.

Furthermore, the method 600 comprises an act 608 of epitaxially growing a III-V semiconductor film. For example, the III-V semiconductor film can be grown under conditions that promote the formation of a p-type doped semiconductor film.

Accordingly, the diagrams and figures provided in FIG. 1 through FIG. 6 illustrate a number of methods that can be used to dope an III-V semiconductor film.

The present invention may be embodied in other specific forms without departing from its spirit or essential characteristics. The described embodiments are to be considered in all respects only as illustrative and not restrictive. The scope of the invention is, therefore, indicated by the appended claims rather than by the foregoing description. All changes which come within the meaning and range of equivalency of the claims are to be embraced within their scope.

REFERENCES

The above Background and Detailed Description cite to various references. A complete list of these references is included below, and each is incorporated herein by reference in its entirety. All patents, applications, references, and publications cited herein are incorporated by reference in their entirety to the same extent as if they were individually incorporated by reference.

[1] M. Copel, M. C. Reuter, E. Kaxiras, R. M. Tromp, *Phys. Rev. Lett.* 63 (1989) 632.
[2] G. Rosenfeld, et al., *Phys. Rev. Lett.* 71 (1993) 895.
[3] J. Meyer, J. Vrijmoeth, H. van der Vegt, R. Behm, *Phys. Rev. B* 51 (1995) 14790.
[4] M. R. Pillai, S.-S. Kim, S. T. Ho, S. A. Barnett, *J. Vac. Sci. Technol. B* 18 (2000) 1232.
[5] E. Rudkevich, F. Liu, D. E. Savage, T. F. Kuech, L. McCaughan, M. G. Lagally, *Phys. Rev. Lett.* 81 (1998) 3467.
[6] C. M. Fetzer, R. T. Lee, J. K. Schurtleff, G. B. Stringfellow, S. M. Lee, T. Y. Seong, *Appl. Phys. Lett.* 76 (2000) 1440.
[7] D. C. Chapman, A. D. Howard, G. B. Stringfellow, *J. Crystal Growth* 287 (2006) 647.
[8] A. D. Howard, D. C. Chapman, G. B. Stringfellow, *J. Appl. Phys.* 100 (2006) 44904.
[9] R. R. Wixom, L. W. Rieth, G. B. Stringfellow, *J. Crystal Growth* 265 (2004) 367-374.
[10] W. Shockley, J. L. Moll, *Phys. Rev.* 119 (5) (1960) 1480.
[11] S. J. Pearton, H. Cho, F. Ren, J. I. Chyi, J. Han, R. G. Wilson, in: R. Feenstra, T. Myers, M. S. Shur, H. Amano (Eds.), GaN and Related Alloys, vol. 595, Materials Research Society, 2000, pp. W10.6.1-W10.6.10.
[12] J. K. Shurtleff, S. W. Jun, G. B. Stringfellow, *Appl. Phys. Lett.* 78 (2001) 3038.
[13] J. Y. Zhu, F. Liu, G. B. Stringfellow, *Phys. Rev. Lett.* 101 (2008) 196103.
[14] L. Zhang, E. G. Wang, Q. K. Xue, S. B. Zhang, Z. Zhang, *Phys. Rev. Lett.* 97 (2006) 126103.
[15] P. K. Larsen, D. J. Chadi, *Phys. Rev. B* 37 (1988) 8282.
[16] S. D. Burnham, G. Namkoong, W. Henderson, W. A. Doolittle, *J. Crystal Growth* 279 (2005) 26-30.
[17] G. Kresse, J. Hafner, *Phys. Rev. B* 49 (1994) 14251; G. Kresse, J. Furthmuller, *Comput. Mater. Sci.* 6 (1996) 15.
[20] R. Wixom, N. A. Modine, G. B. Stringfellow, *Phys. Rev. B* 67 (2003) 115309.
[21] C. G. VandeWalle, J. Neugebauer, *Phys. Rev. Lett.* 88 (2002) 066103.
[22] O. Knacke, O. Kubaschewski, K. Hesselmann (Eds.), *Thermochemical Properties of Inorganic Substances*, second Ed., Springer-Verlag, 1991, pp. 728, 743, 803.
[23] G. B. Stringfellow, *Organometallic Vapor-Phase Epitaxy, Theory and Practice*, second ed., Academic Press, 1999, pp. 141, 243.
[24] M. Sugiyama, S. Maeyama, F. Maeda, M. Oshima, *Phys. Rev. B* 52 (1995) 2678.
[25] A. L. Allred, J. *Inorg, Nucl. Chem.* 17 (1961) 215.
[26] F. Liu, M. G. Lagally, *Phys. Rev. Lett.* 76 (1996) 3156.
[27] B. Cordero, V. Gmez, A. E. Platero-Prats, M. Revs, J. Echeverra, E. Cremades, F. Barragn, S. Alvarez, *Dalton Trans.* 2008 (2008) 2832-2838.
[28] M. D. McCluskey, E. E. Haller, J. W. Walker, N. M. Johnson, *Appl. Phys. Lett.* 65 (1994) 2191.
[29] E. V. K. Rao, B. Theys, Y. Gottesman, H. Bissesur, in: 11th *International Conference on Indium Phosphide and Related Materials*, IEEE, 0-7803-5562-8/99, 1999.
[30] C. H. Chen, S. A. Stockman, M. J. Peanasky, C. P. Kuo, in: G. B. Stringfellow, M. G. Craford (Eds.), Semiconductors and Semimetals, vol. 48, Academic Press, New York, 1997, pp. 122-127.
[31] M. D. Sturge, *Statistical and Thermal Physics: Fundamentals and Applications*, illustrated ed., A K Peters, Ltd., 2003, p. 136.
[32] M. Ilegems, H. C. Montgomery, *J. Phys. Chem. Solids* 34 (1973) 885.

What is claimed is:

1. A method of doping a III-V semiconductor film, the method comprising:
    presenting a p-type dopant which comprises cadmium to an epitaxial growth process;
    presenting a surfactant capable of acting as an electron reservoir to the epitaxial growth process;
    presenting hydrogen to the epitaxial growth process; and
    growing a III-V semiconductor film under conditions including the p-type dopant, the surfactant, and the hydrogen throughout the epitaxial growth process that promote the formation of a p-type doped III-V semiconductor film.

2. The method recited in claim 1, wherein the presenting a surfactant capable of acting as an electron reservoir to the epitaxial growth process comprises presenting Sb.

3. The method recited in claim 1, wherein the presenting a surfactant capable of acting as an electron reservoir to the epitaxial growth process comprises presenting Bi.

4. The method recited in claim 1, wherein the presenting hydrogen to the epitaxial growth process comprises:
    initiating the epitaxial growth process at a first hydrogen partial pressure; and
    increasing the hydrogen partial pressure from the first hydrogen partial pressure to a second hydrogen partial pressure during the epitaxial growth process.

5. The method recited in claim 1, further including annealing the p-type doped III-V semiconductor film to remove co-doped hydrogen from the III-V semiconductor film.

6. The method recited in claim 1, wherein growing the III-V semiconductor film includes using an OMVPE growth process.

7. The method recited in claim 1, wherein growing the III-V semiconductor film includes using a MBE process.

8. The method recited in claim 1, wherein growing the III-V semiconductor film includes using a CBE process.

9. The method of claim 1, wherein the III-V semiconductor film is a GaP semiconductor film.

10. A method of doping a semiconductor film, comprising:
    growing a semiconductor film in the presence of
        a p-type dopant which comprises cadmium;
        a surfactant; and
        a hydrogen source; and
    creating conditions during the growing of the semiconductor film that promote the formation of a semiconductor film doped with the p-type dopant, such that the p-type dopant, the surfactant and the hydrogen source are present throughout growth of the semiconductor film doped with the p-type dopant.

11. The method recited in claim 10, wherein the surfactant is capable of acting as an electron reservoir.

12. The method recited in claim 11, wherein the surfactant is Bi.

13. The method recited in claim 11, wherein the surfactant is Sb.

14. The method recited in claim 13, wherein growing a semiconductor film in the presence of a hydrogen source further includes:
   initiating the growth of the semiconductor film at a first hydrogen partial pressure; and
   increasing the hydrogen partial pressure from the first hydrogen partial pressure to a second hydrogen partial pressure during the growth of the semiconductor film.

15. The method of claim 10, wherein the semiconductor film is a GaP semiconductor film.

16. A method of doping a III-V semiconductor film, the method comprising:
   growing epitaxially the III-V semiconductor film entirely in the presence of a p-type dopant which is cadmium, a surfactant capable of acting as an electron reservoir, and hydrogen, under conditions that promote the formation of a p-type doped III-V semiconductor film.

17. The method recited in claim 16, wherein the growing epitaxially of the III-V semiconductor film further includes:
   initiating the epitaxial growth at a first hydrogen partial pressure and maintaining the first hydrogen partial pressure for a first period of time during the growing; and
   increasing the hydrogen partial pressure to a second hydrogen partial pressure and maintaining the second hydrogen partial pressure for a second period of time during the growing.

18. The method of claim 16, further including annealing the p-type doped III-V semiconductor film at a temperature and for a time sufficient to remove hydrogen from the p-type doped III-V semiconductor film.

19. The method of 16, wherein the III-V semiconductor film is a GaP semiconductor film.

* * * * *